(12) United States Patent
Hashimoto

(10) Patent No.: US 12,183,495 B2
(45) Date of Patent: *Dec. 31, 2024

(54) MAGNETOPLUMBITE-TYPE HEXAGONAL FERRITE AND METHOD FOR PRODUCING RADIO WAVE ABSORBER

(71) Applicant: FUJIFILM Corporation, Tokyo (JP)

(72) Inventor: Hirokazu Hashimoto, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 725 days.

This patent is subject to a terminal disclaimer.

(21) Appl. No.: 17/176,279

(22) Filed: Feb. 16, 2021

(65) Prior Publication Data

US 2021/0166850 A1 Jun. 3, 2021

Related U.S. Application Data

(63) Continuation of application No. PCT/JP2019/016009, filed on Apr. 12, 2019.

(30) Foreign Application Priority Data

Aug. 28, 2018 (JP) .................................. 2018-159194

(51) Int. Cl.
| | |
|---|---|
| H01F 1/34 | (2006.01) |
| H01F 1/36 | (2006.01) |
| H01F 1/37 | (2006.01) |
| H05K 9/00 | (2006.01) |

(52) U.S. Cl.
CPC ........... *H01F 1/348* (2013.01); *H05K 9/0075* (2013.01)

(58) Field of Classification Search
CPC ... H01F 1/348; H01F 1/34; H01F 1/36; H01F 1/37; H01F 1/10; H01F 1/11; H01F 1/205
See application file for complete search history.

(56) References Cited

U.S. PATENT DOCUMENTS

| | | | |
|---|---|---|---|
| 11,721,461 B2 * | 8/2023 | Hosoya | ............... C04B 35/2683 252/62.54 |
| 2004/0053075 A1 | 3/2004 | Oda et al. | |
| 2012/0177951 A1 * | 7/2012 | Yamazaki | .................. H01F 1/11 252/62.58 |
| 2015/0187380 A1 | 7/2015 | Shirata | |
| 2020/0335247 A1 | 10/2020 | Hosoya et al. | |

FOREIGN PATENT DOCUMENTS

| | | |
|---|---|---|
| CN | 1462453 A | 12/2003 |
| CN | 111527572 A | 8/2020 |
| DE | 37 29 693 A1 | 5/1988 |
| JP | 64-000707 A | 1/1989 |
| JP | 7-172839 A | 7/1995 |
| JP | 11-354972 A | 12/1999 |
| JP | 2007-250823 A | 9/2007 |
| JP | 2008-169378 A | 7/2008 |
| JP | 2010-077198 A | 4/2010 |
| JP | 4674380 B2 | 4/2011 |
| JP | 2011-093762 A | 5/2011 |
| JP | 2011-207732 A | 10/2011 |
| JP | 2015-127985 A | 7/2015 |

OTHER PUBLICATIONS

Google Patents machine translation of JP2011093762A, 12 pages. (Year: 2011).*
Communication dated Jan. 18, 2022 from the Korean Patent Office in Korean Application No. 10-2021-7004545.
Chinese Office Action dated Oct. 20, 2023 in Application No. 201980056050.2.
Office Action dated Nov. 2, 2021 from the Japanese Patent Office in JP Application No. 2020-540047.
International Search Report dated Jun. 25, 2019, issued by the International Searching Authority in application No. PCT/JP2019/016009.
Written Opinion dated Jun. 25, 2019, issued by the International Searching Authority in application No. PCT/JP2019/016009.
International Preliminary Report on Patentability dated Mar. 2, 2021, issued by the International Bureau in application No. PCT/JP2019/016009.
Extended European Search Report dated Sep. 24, 2021, issued by the European Patent Office in application No. 19856047.6.
Communication dated May 16, 2022 from the Korean Intellectual Property Office in Application No. 10-2021-7004545.
Chinese Office Action dated Mar. 6, 2024 in Application No. 201980056050.2.

* cited by examiner

*Primary Examiner* — Matthew E. Hoban
*Assistant Examiner* — Lynne Edmondson
(74) *Attorney, Agent, or Firm* — Sughrue Mion, PLLC

(57) ABSTRACT

A method for producing a powder of a magnetoplumbite-type hexagonal ferrite which is an aggregate of particles of a compound represented by Formula (1), the method including: a step A of adjusting a pH of an aqueous solution containing a Fe salt, an Al salt, and at least one metal element salt selected from the group consisting of a Sr salt, a Ba salt, a Ca salt, and a Pb salt to exceed 8.0, thereby obtaining a reaction product; a step B of drying the reaction product obtained in the step A, thereby obtaining a dried product; and a step C of firing the dried product obtained in Step B, thereby obtaining a fired product, and application. In Formula (1), A represents at least one metal element selected from the group consisting of Sr, Ba, Ca, and Pb, and x satisfies $1.5 \leq x \leq 8.0$.

$$AFe_{(12-x)}Al_xO_{19} \quad \text{Formula (1)}$$

7 Claims, 1 Drawing Sheet

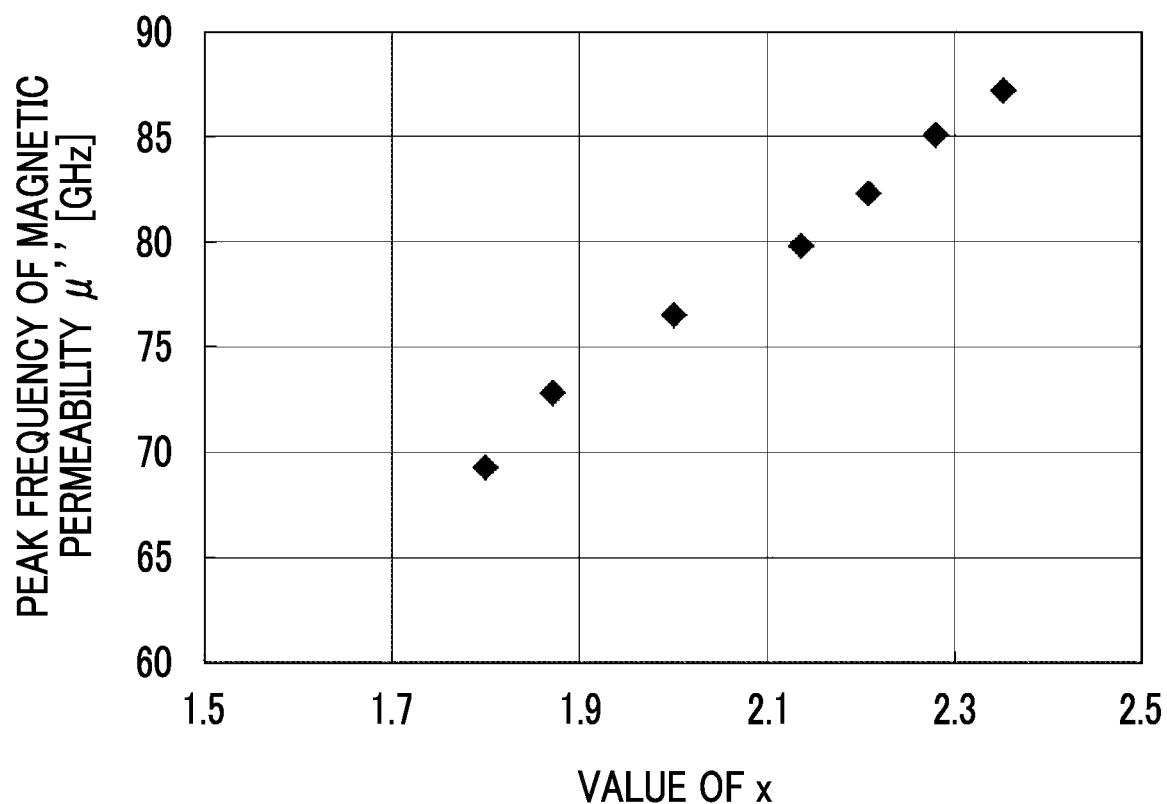

MAGNETOPLUMBITE-TYPE HEXAGONAL FERRITE AND METHOD FOR PRODUCING RADIO WAVE ABSORBER

CROSS-REFERENCE TO RELATED APPLICATIONS

This application is a continuation application of International Application No. PCT/JP2019/016009, filed Apr. 12, 2019, the disclosure of which is incorporated herein by reference in its entirety. Further, this application claims priority from Japanese Patent Application No. 2018-159194, filed Aug. 28, 2018, the disclosure of which is incorporated herein by reference in its entirety.

BACKGROUND OF THE INVENTION

1. Field of the Invention

The present disclosure relates to a method for producing a powder of a magnetoplumbite-type hexagonal ferrite and a method for producing a radio wave absorber.

2. Description of the Related Art

In recent years, along with the diversification of the use of radio waves in high frequency bands, such as electronic toll collection systems (ETC), advanced cruise-assist highway systems (AHS), and satellite broadcasting, malfunctions and failures of electronic devices due to radio wave interference have been problems. In order to reduce the influence of such radio wave interference on electronic devices, a radio wave absorber absorbs unnecessary radio waves to prevent the reflection of the radio waves.

As a radio wave absorber, a radio wave absorber using a magnetic material is often used. A radio wave incident to the radio wave absorber including a magnetic material generates a magnetic field in the magnetic material. In a case where the generated magnetic field is reduced to radio wave energy, part of the energy is lost and absorbed. Accordingly, in the radio wave absorber including the magnetic material, a frequency band in which the effect is obtained differs depending on the type of the magnetic material used.

For example, JP4674380B discloses a magnetic powder for a radio wave absorber in which a peak particle size of laser diffraction scattering particle size distribution is 10 μm or more in a powder of a magnetoplumbite-type hexagonal ferrite represented by a composition formula $AFe_{(12-x)}Al_xO_{19}$, in which A is one or more of Sr, Ba, Ca, and Pb, and x is 1.0 to 2.2. According to the magnetic powder for a radio wave absorber disclosed in JP4674380B, excellent radio wave absorption performance is exhibited near 76 GHz.

SUMMARY OF THE INVENTION

With the rapid development of information and communication technologies in recent years, the usage of radio waves is expected to become increasingly diversified. Therefore, from a viewpoint of coping with radio waves with various frequencies, development of a radio wave absorber capable of exhibiting excellent radio wave absorption performance in a target frequency band is desired.

The present inventors focused on a magnetoplumbite-type hexagonal ferrite in which a part of iron is substituted with aluminum (hereinafter, also simply referred to as "magnetoplumbite-type hexagonal ferrite") as a magnetic material suitable for a radio wave absorber. However, the radio wave absorber formed of the powder of the magnetoplumbite-type hexagonal ferrite, it was extremely difficult to adjust a peak frequency of the magnetoplumbite-type hexagonal ferrite to a target frequency band.

Regarding the point described above, JP4674380B does not disclose at all about the adjusting the peak frequency of the magnetoplumbite-type hexagonal ferrite to the frequency band of the target.

In addition, an object of an aspect of the invention is to provide a method for producing a powder of a magnetoplumbite-type hexagonal ferrite capable of producing a powder of a magnetoplumbite-type hexagonal ferrite having a desired peak frequency, and a method for producing a radio wave absorber.

A unit for achieving the objects includes the following aspects.

<1> A method for producing a powder of a magnetoplumbite-type hexagonal ferrite which is an aggregate of particles of a compound represented by Formula (1), the method comprising:

a step A of adjusting a pH of an aqueous solution containing a Fe salt, an Al salt, and at least one metal element salt selected from the group consisting of a Sr salt, a Ba salt, a Ca salt, and a Pb salt to exceed 8.0, thereby obtaining a reaction product;

a step B of drying the reaction product obtained in the step A, thereby obtaining a dried product; and a step C of firing the dried product obtained in Step B, thereby obtaining a fired product.

$$AFe_{(12-x)}Al_xO_{19} \qquad \text{Formula (1)}$$

In Formula (1), A represents at least one metal element selected from the group consisting of Sr, Ba, Ca, and Pb, and x satisfies $1.5 \leq x \leq 8.0$.

<2> The method for producing a powder of a magnetoplumbite-type hexagonal ferrite according to <1>, in which, in the step A, the pH of the aqueous solution is adjusted to be 9.0 or more to obtain the reaction product.

<3> The method for producing a powder of a magnetoplumbite-type hexagonal ferrite according to <1> or <2>, in which, in the step A, a liquid temperature of the aqueous solution is 15° C. to 40° C.

<4> The method for producing a powder of a magnetoplumbite-type hexagonal ferrite according to any one of <1> to <3>, in which x in Formula (1) satisfies $1.5 \leq x \leq 3.0$.

<5> A method for producing a radio wave absorber, the method comprising: a step I of obtaining a powder of a magnetoplumbite-type hexagonal ferrite by the method for producing a powder of a magnetoplumbite-type hexagonal ferrite according to any one of <1> to <4>; and a step II of forming a molded body using a composition for a radio wave absorber containing the powder of the magnetoplumbite-type hexagonal ferrite obtained in the step I, and a binder.

According to the aspect of the invention, there are provided a method for producing a powder of a magnetoplumbite-type hexagonal ferrite capable of producing a powder of a magnetoplumbite-type hexagonal ferrite having a desired peak frequency, and a method for producing a radio wave absorber.

BRIEF DESCRIPTION OF THE DRAWINGS

FIG. 1 is a graph showing a relationship between a value of x in Formula (1) and a peak frequency of magnetic permeability μ" in examples.

DESCRIPTION OF THE PREFERRED EMBODIMENTS

Hereinafter, an example of an embodiment of a method for producing a powder of a magnetoplumbite-type hexagonal ferrite to which the invention is applied will be described.

Here, the invention is not limited to the embodiments hereinafter, and modifications can be suitably added within the range of the object of the invention.

A range of numerical values shown using "to" in the disclosure means a range including numerical values before and after "to" as a minimum value and a maximum value.

In the range of numerical values disclosed in stepwise in the disclosure, an upper limit value and a lower limit value disclosed in a certain range of numerical values may be replaced with an upper limit value and a lower limit value disclosed in another range of numerical values disclosed in stepwise. In addition, in the range of numerical values disclosed in the disclosure, an upper limit value and a lower limit value disclosed in a certain range of numerical values may be replaced with values shown in examples.

In the disclosure, a combination of two or more preferred aspects is a more preferred aspect.

In the disclosure, in a case where plural kinds of substances corresponding to each component are present, an amount of each component means the amount of all of the plural kinds of substances, unless otherwise noted.

In the disclosure, a term "step" does not only mean an individual step, but also include a case a step cannot be clearly differentiated from another step, in a case where the desired object of the step is achieved.

[Method for Producing Powder of Magnetoplumbite-Type Hexagonal Ferrite]

A method for producing a powder of a magnetoplumbite-type hexagonal ferrite (hereinafter also referred to as a "magnetoplumbite-type hexagonal ferrite powder") of the disclosure, which is an aggregate of particles of a compound represented by Formula (1), and the method includes a step A of adjusting a pH of an aqueous solution (hereinafter, also referred to as a "raw material aqueous solution") containing a Fe salt, an Al salt, and at least one metal element (hereinafter, also referred to as a "specific metal element") salt selected from the group consisting of a Sr salt, a Ba salt, a Ca salt, and a Pb salt to exceed 8.0, thereby obtaining a reaction product, a step B of drying the reaction product obtained in the step A, thereby obtaining a dried product, and a step C of firing the dried product obtained in Step B, thereby obtaining a fired product.

Hereinafter, the "method for producing the powder of the magnetoplumbite-type hexagonal ferrite of the disclosure" is also referred to as the "producing method of the disclosure".

The step A, the step B, and the step C may each be divided into two or more stages. In addition, the producing method of the disclosure may include steps other than the step A, the step B, and the step C, as necessary, within a range not negatively affecting the effect of the invention.

$$AFe_{(12-x)}Al_xO_{19}$$ 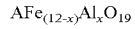 Formula (1)

In Formula (1), A represents at least one metal element selected from the group consisting of Sr, Ba, Ca, and Pb, and x satisfies $1.5 \leq x \leq 8.0$.

As described above, with the rapid development of information and communication technologies in recent years, from a viewpoint of coping with radio waves with various frequencies, development of a radio wave absorber capable of exhibiting excellent radio wave absorption performance in a target frequency band is desired.

The present inventors focused on a magnetoplumbite-type hexagonal ferrite in which a part of iron is substituted with aluminum as a magnetic material suitable for a radio wave absorber. However, the radio wave absorber formed of the powder of the magnetoplumbite-type hexagonal ferrite has excellent radio wave absorption performance, but has a narrow bandwidth. Accordingly, it was extremely difficult to adjust a peak frequency of the magnetoplumbite-type hexagonal ferrite to a target frequency band.

On the other hand, the producing method of the disclosure includes the step A of adjusting a pH of an aqueous solution (that is, raw material aqueous solution) containing a Fe salt, an Al salt, and at least one metal element salt selected from the group consisting of a Sr salt, a Ba salt, a Ca salt, and a Pb salt to exceed 8.0, thereby obtaining a reaction product, and accordingly, a powder of a magnetoplumbite-type hexagonal ferrite having a desired peak frequency can be produced.

In the step A of obtaining the reaction product by adjusting the pH of the raw material aqueous solution to exceed 8.0, in a case where the adjusted pH of the raw material aqueous solution is increased, a ratio of Al atoms to Fe atoms in the magnetoplumbite-type hexagonal ferrite finally obtained [that is, value of x in Formula (1)] is decreased. In addition, there is a high correlation between the adjusted pH of the raw material aqueous solution and the value of x in Formula (1).

On the other hand, in a case where the ratio of Al atoms to Fe atoms in the magnetoplumbite-type hexagonal ferrite [that is, value of x in Formula (1)] is increased, the peak frequency of the magnetoplumbite-type hexagonal ferrite shifts to a higher frequency band. In addition, there is a high correlation between the value of x in Formula (1) and the peak frequency of the magnetoplumbite-type hexagonal ferrite.

The producing method of the disclosure includes the step A of adjusting the pH of the raw material aqueous solution to exceed 8.0 to obtain the reaction product, so that the value of x in Formula (1) can be controlled by the adjusted pH of the raw material aqueous solution. As a result, the powder of the magnetoplumbite-type hexagonal ferrite having a desired peak frequency can be produced.

Hereinafter, each step of the producing method of the disclosure will be described in detail.

<Step A>

The step A is a step of adjusting a pH of an aqueous solution (that is, a raw material aqueous solution) containing a Fe salt, an Al salt, and at least one metal element (that is, specific metal element) salt selected from the group consisting of a Sr salt, a Ba salt, a Ca salt, and a Pb salt to exceed 8.0, thereby obtaining a reaction product.

In the step A, a reaction product serving as a precursor of the magnetoplumbite-type hexagonal ferrite powder can be obtained. It is surmised that the reaction product obtained in the step A is an iron hydroxide, an aluminum hydroxide, or a composite hydroxide of iron, aluminum, and the specific metal element.

In the step A of obtaining the reaction product by adjusting the pH of the raw material aqueous solution to exceed 8.0, in a case where the adjusted pH of the raw material aqueous solution is increased, a ratio of Al atoms to Fe atoms in the magnetoplumbite-type hexagonal ferrite finally obtained [that is, value of x in Formula (1)] is decreased. In addition, there is a high correlation between the adjusted pH of the raw material aqueous solution and the value of x in Formula (1). Further, there is a high correlation between the value of x in Formula (1) and the peak frequency of the magnetoplumbite-type hexagonal ferrite. Accordingly, in the producing method of the disclosure, in the step A of adjusting the pH of the raw material aqueous solution to exceed 8.0 to obtain the reaction product, the adjusted pH of the raw material aqueous solution is controlled, and accordingly, the value of x in Formula (1) can be controlled. Therefore, the powder of the magnetoplumbite-type hexagonal ferrite having a desired peak frequency can be produced.

The salt of the Fe salt, the Al salt, and the salt of the specific metal element is not particularly limited, and for example, from viewpoints of availability and cost, water-soluble inorganic acid salts such as nitrates, sulfates, and chlorides are preferable.

Specific examples of the Fe salt include iron (III) chloride hexahydrate [$FeCl_3 \cdot 6H_2O$] and iron (III) nitrate nonahydrate [$Fe(NO_3)_3 \cdot 9H_2O$].

Specific examples of the Al salt include an aluminum chloride hexahydrate [$AlCl_3 \cdot 6H_2O$] and an aluminum nitrate nonahydrate [$Al(NO_3)_3 \cdot 9H_2O$].

Specific examples of the Sr salt include a strontium chloride hexahydrate [$SrCl_2 \cdot 6H_2O$], a strontium nitrate [$Sr(NO_3)_2$], and a strontium acetate hemihydrate [$Sr(CH_3COO)_2 \cdot 0.5H_2O$].

Specific examples of the Ba salt include a barium chloride dihydrate [$BaCl_2 \cdot 2H_2O$], a barium nitrate [$Ba(NO_3)_2$], and a barium acetate [$(CH_3COO)_2Ba$].

Specific examples of the Ca salt include a calcium chloride dihydrate [$CaCl_2 \cdot 2H_2O$], a calcium nitrate tetrahydrate [$Ca(NO_3)_2 \cdot 4H_2O$], and a calcium acetate monohydrate [$(CH_3COO)_2Ca \cdot H_2O$].

Specific examples of the Pb salt include lead (II) chloride [$PbCl_2$] and lead (II) nitrate [$Pb(NO_3)_2$].

The salt of the specific metal element is not particularly limited, as long as it is at least one metal element salt selected from the group consisting of a Sr salt, a Ba salt, a Ca salt, and a Pb salt.

For example, from a viewpoint of operability and handleability, the salt of the specific metal element is preferably at least one metal element salt selected from the group consisting of a Sr salt, a Ba salt, and a Ca salt.

In addition, the salt of specific metal element preferably contains a Sr salt and is more preferably a Sr salt, from a viewpoint of obtaining the magnetoplumbite-type hexagonal ferrite powder capable of producing a radio wave absorber exhibiting excellent radio wave absorption performance near 79 GHz.

In the step A, the pH of the raw material aqueous solution is adjusted to exceed 8.0, thereby obtaining a reaction product.

In the step A, the pH of the raw material aqueous solution is adjusted to exceed 8.0, thereby obtaining a reaction product in a plurality of steps of two or more steps.

The adjusted pH of the raw material aqueous solution is, for example, preferably 8.5 or more, more preferably 9.0 or more, and even more preferably 9.5 or more, from a viewpoint of controlling the value of x in Formula (1) in more excellent manner.

The adjusted pH of the raw material aqueous solution is, for example, preferably 13.0 or less, more preferably 12.5 or less, even more preferably 12.0 or less, still preferably 11.5 or less, and still more preferably 11.0 or less, from a viewpoint of more easily obtaining a reaction product.

The adjustment pH of the raw material aqueous solution is a value measured using a pH meter.

As the pH meter, for example, a tabletop pH meter F-71 (product name) manufactured by HORIBA, Ltd. can be preferably used. However, the pH meter is not limited to this.

A liquid temperature of the raw material aqueous solution in a case of adjusting the pH to exceed 8.0 is not particularly limited, and is, for example, preferably 5° C. to 90° C., more preferably 10° C. to 55° C., and even more preferably 15° C. to 40° C., from a viewpoint of more efficiently obtaining the reaction product.

A unit for adjusting the temperature is not particularly limited, and a general heating device, cooling device, or the like can be used.

A preferred embodiment of the step A is an embodiment in which the pH of the raw material aqueous solution is adjusted to 8.5 or more to obtain the reaction product while the liquid temperature of the raw material aqueous solution is maintained at 15° C. to 40° C.

A more preferred embodiment of the step A is an embodiment in which the pH of the raw material aqueous solution is adjusted to 9.0 or more to obtain the reaction product while maintaining the liquid temperature of the raw material aqueous solution at 15° C. to 40° C.

An even more preferred embodiment of the step A is an embodiment in which the reaction product is obtained through a first pH adjusting step of adjusting the pH of the raw material aqueous solution to 6.0 to 8.0 to obtain a first solution while maintaining the liquid temperature of the raw material aqueous solution at 30° C. to 40° C., and a second pH adjusting step of adjusting the pH of the first solution to 8.5 or more to obtain a second solution, after changing the liquid temperature of the first solution obtained in the first pH adjusting step to 20° C. or higher and lower than 30° C.

A particularly preferred embodiment of the step A is an embodiment in which the reaction product is obtained through a first pH adjusting step of adjusting the pH of the raw material aqueous solution to 6.0 to 8.0 to obtain a first solution while maintaining the liquid temperature of the raw material aqueous solution at 30° C. to 40° C., and a second pH adjusting step of adjusting the pH of the first solution to 9.0 or more to obtain a second solution, after changing the liquid temperature of the first solution obtained in the first pH adjusting step to 20° C. or higher and lower than 30° C.

The step A preferably includes a step of mixing an aqueous solution (that is, raw material aqueous solution) containing an Fe salt, an Al salt, and a salt of the specific metal element with an alkali aqueous solution and adjusting the pH of the raw material aqueous solution to exceed 8.0, thereby obtaining a solution (so-called precursor-containing solution) including reaction product (hereinafter, referred to as "Step A1").

In addition, the step A preferably includes a step of separating the reaction product from a liquid including the reaction product obtained in step A1 (hereinafter, also referred to as "step A2").

(Step A1)

The step A1 is a step of mixing an aqueous solution (that is, raw material aqueous solution) containing an Fe salt, an Al salt, and a salt of the specific metal element with an alkali aqueous solution and adjusting the pH of the raw material aqueous solution to exceed 8.0, thereby obtaining a reaction product.

In the step A1, the raw material aqueous solution is mixed with the alkali aqueous solution to set the pH of the raw material aqueous solution to exceed 8.0, thereby generating a precipitate of the reaction product.

The alkali aqueous solution is not particularly limited, and examples thereof include a sodium hydroxide aqueous solution and a potassium hydroxide aqueous solution.

A concentration of the alkali aqueous solution is not particularly limited, and may be, for example, 0.1 mol/L (liter: the same applies hereinafter) to 10.0 mol/L.

The raw material aqueous solution and the alkali aqueous solution may be simply mixed with each other.

The raw material aqueous solution and the alkali aqueous solution may be mixed in their entirety prepared in advance at once, or the raw material aqueous solution and the alkali aqueous solution may be gradually mixed little by little. Alternatively, the mixture may be added to one of the raw material aqueous solution and the alkali aqueous solution while the other is added little by little.

For example, from a viewpoint of easily controlling the adjusted pH of the raw material aqueous solution, it is preferable to mix the raw material aqueous solution while adding the alkali aqueous solution.

In addition, for example, from a viewpoint of reproducibility of the composition of the reaction product, it is preferable that the raw material aqueous solution and the alkali aqueous solution are gradually mixed little by little.

The method of mixing the raw material aqueous solution and the alkali aqueous solution is not particularly limited, and examples thereof include a method of mixing by stirring.

A stirring unit is not particularly limited, and a general stirring tool or a stirring device can be used.

The stirring time is not particularly limited as long as the reaction of the components to be mixed is completed, and can be appropriately set according to the composition of the raw material aqueous solution, the type of the stirring tool or the stirring device, and the like.

A mixing ratio of the raw material aqueous solution and the alkali aqueous solution is not particularly limited, and for example, is suitably set according to the desired adjustment pH of the raw material aqueous solution.

(Step A2)

Step A2 is a step of separating the reaction product from a liquid including the reaction product obtained in step A1.

In the step A2, a reaction product serving as a precursor of the magnetoplumbite-type hexagonal ferrite powder (that is, the reaction product in step A) can be obtained.

The method of separating the reaction product from the liquid including the reaction product is not particularly limited, and examples thereof include decantation, centrifugal separation, and filtration (for example, suction filtration and pressure filtration).

In a case where the method of separating the reaction product from the liquid including the reaction product is centrifugal separation, the conditions for centrifugal separation are not particularly limited. For example, centrifugal separation is preferably performed at a rotation speed of 2,000 revolutions per minute (rpm; the same applies hereinafter) for 3 minutes to 30 minutes. The centrifugal separation may be performed a plurality of times.

<Step B>

The step B is a step of drying the reaction product obtained in the step A, thereby obtaining a dried product (so-called precursor powder).

In a case of using the reaction product obtained in the step A for producing the radio wave absorber by drying before firing, the reproducibility of the radio wave absorption performance of the produced radio wave absorber tends to be excellent.

The drying unit is not particularly limited, and examples thereof include a dryer such as an oven.

The drying temperature is not particularly limited, and is, for example, preferably 50° C. to 200° C. and more preferably from 70° C. to 150° C.

The drying time is not particularly limited, and for example, is preferably 2 hours to 50 hours and more preferably 5 hours to 30 hours.

<Step C>

Step C: a step of firing the dried product obtained in Step B, thereby obtaining a fired product.

In step C, the dried product obtained in step B is fired, thereby obtaining a fired product which is the powder of the magnetoplumbite-type hexagonal ferrite.

The Firing can be performed using a heating device.

The heating device is not particularly limited as long as it can heat to a target temperature, and any well-known heating device can be used. As the heating device, for example, in addition to an electric furnace, a firing device uniquely produced according to a production line can be used.

The firing is preferably performed in the atmosphere.

The firing temperature is not particularly limited, and is, for example, preferably 900° C. or higher, more preferably 900° C. to 1,400° C., and even more preferably 1,000° C. to 1,200° C.

The firing time is not particularly limited, and is, for example, preferably 1 hour to 10 hours and more preferably 2 hours to 6 hours.

—Magnetoplumbite-Type Hexagonal Ferrite Powder—

According to the producing method of the disclosure, the magnetoplumbite-type hexagonal ferrite powder which is an aggregate of particles of a compound represented by Formula (1) can be produced.

Regarding A in Formula (1), the kind or number of metal elements are not particularly limited as long as A is at least one metal element selected from the group consisting of Sr, Ba, Ca, and Pb.

For example, from a viewpoint of operability and handleability, A in Formula (1) is preferably at least one metal element selected from the group consisting of Sr, Ba, and Ca.

In addition, A in Formula (1) preferably contains Sr and is more preferably Sr, from a viewpoint that a radio wave absorber exhibiting excellent radio wave absorption performance near 79 GHz can be produced.

x in Formula (1) satisfies $1.5 \leq x \leq 8.0$, preferably satisfies $1.5 \leq x \leq 6.0$, more preferably satisfies $1.5 \leq x \leq 4.0$, and even more preferably satisfies $1.5 \leq x \leq 3.0$.

In a case where x in Formula (1) is 1.5 or more, radio waves in a frequency band higher than 60 GHz can be absorbed.

In addition, in a case where x in Formula (1) is 8.0 or less, the magnetoplumbite-type hexagonal ferrite has magnetism.

Examples of the magnetoplumbite-type hexagonal ferrite which is the compound represented by Formula (1) obtained by the producing method of the disclosure include $SrFe_{(10.44)}Al_{(1.56)}O_{19}$, $SrFe_{(10.20)}Al_{(1.80)}O_{19}$, $SrFe_{(10.13)}Al_{(1.87)}O_{19}$, $SrFe_{(10.00)}Al_{(2.00)}O_{19}$, $SrFe_{(9.95)}Al_{(2.05)}O_{19}$, $SrFe_{(9.86)}Al_{(2.14)}O_{19}$, $SrFe_{(9.85)}Al_{(2.15)}O_{19}$, $SrFe_{(9.79)}Al_{(2.21)}O_{19}$, $SrFe_{(9.74)}Al_{(2.26)}O_{19}$, $SrFe_{(9.72)}Al_{(2.28)}O_{19}$, $SrFe_{(9.65)}Al_{(2.35)}O_{19}$, $SrFe_{(9.58)}Al_{(2.42)}O_{19}$, $SrFe_{(9.37)}Al_{(2.63)}O_{19}$, $SrFe_{(9.33)}Al_{(2.67)}O_{19}$, $SrFe_{(9.27)}Al_{(2.73)}O_{19}$, $SrFe_{(7.88)}Al_{(4.12)}O_{19}$, $SrFe_{(7.71)}Al_{(4.29)}O_{19}$, $SrFe_{(7.37)}Al_{(4.63)}O_{19}$, $SrFe_{(7.04)}Al_{(4.96)}O_{19}$, $SrFe_{(6.25)}Al_{(5.75)}O_{19}$, $BaFe_{(9.50)}Al_{(2.50)}O_{19}$, $BaFe_{(10.05)}Al_{(1.95)}O_{19}$, $CaFe_{(10.00)}Al_{(2.00)}O_{19}$, $PbFe_{(9.00)}$ $Al_{(3.00)}O_{19}$, $Sr_{(0.80)}Ba_{(0.10)}Ca_{(0.10)}Fe_{(9.83)}Al_{(2.17)}O_{19}$, $Sr_{(0.80)}Ba_{(0.10)}Ca_{(0.10)}Fe_{(9.69)}Al_{(2.31)}O_{19}$, and $Sr_{(0.80)}Ba_{(0.10)}Fe_{(8.85)}Al_{(3.15)}O_{19}$.

The composition of the magnetoplumbite-type hexagonal ferrite obtained by the producing method of the disclosure is confirmed by high frequency inductively coupled plasma (ICP) emission spectroscopy.

Specifically, a pressure-resistant container containing 12 mg of a sample powder and 10 mL of a 4 mol/L hydrochloric acid aqueous solution is held in an oven at a set temperature of 120° C. for 12 hours to obtain a solution. Next, 30 mL of pure water is added to the obtained solution, which is then filtered using a 0.1 µm membrane filter. Elemental analysis of the filtrate obtained as described above is performed using a high frequency inductively coupled plasma (ICP) emission spectrometer. Based on the obtained elemental analysis results, a content of each metal atom with respect to 100 atom % of Fe atoms is obtained. The composition is confirmed based on the obtained content.

As the ICP emission spectrometer, for example, ICPS-8100 (model number) manufactured by Shimadzu Corporation can be suitably used. However, the ICP emission spectrometer is not limited thereto.

A crystal phase of the magnetoplumbite-type hexagonal ferrite obtained by the producing method of the disclosure may or may not be a single phase, but is preferably a single phase.

In a case where a content of aluminum is the same, the powder of the magnetoplumbite-type hexagonal ferrite with a single crystal phase tends to have high coercivity and more excellent magnetic properties, compared to a powder of a magnetoplumbite-type hexagonal ferrite not having a single crystal phase (for example, having two crystal phases).

In the disclosure, the expression "the crystal phase is a single phase" indicates that only one kind of diffraction pattern showing a crystal structure of magnetoplumbite-type hexagonal ferrite having any composition is observed in powder X-ray diffraction (XRD) measurement.

On the other hand, in the disclosure, the expression "the crystal phase is not a single phase" indicates that there is such a case where a plurality of magnetoplumbite-type hexagonal ferrites of any composition are mixed, and two or more kinds of diffraction patterns are observed or diffraction patterns of crystal other than the magnetoplumbite-type hexagonal ferrite are observed.

In a case where the crystal phase is not a single phase, a diffraction pattern having a main peak and other peaks is obtained. Here, the "main peak" refers to a peak having the highest value of diffraction intensity in the observed diffraction pattern.

In a case where the magnetoplumbite-type hexagonal ferrite powder obtained by the producing method of the disclosure includes a magnetoplumbite-type hexagonal ferrite powder that is not a single phase, a ratio (Is/Im) of a value of the diffraction intensity of the other peak (hereinafter, referred to as "Is") to a value of the main peak (hereinafter, referred to as "Im") obtained by powder X-ray diffraction (XRD) measurement is, for example, preferably ½ or less more preferably ⅕ or less, from a viewpoint of producing a radio wave absorber having more excellent radio wave absorption performance.

In a case where two or more types of diffraction patterns are overlapped with each other and the peaks of the diffraction patterns have maximum values, the respective maximum values are defined as Im and Is, and the ratio thereof is obtained. In addition, in a case where two or more types of diffraction patterns are overlapped with each other and the other peak is observed as a shoulder of the main peak, the maximum intensity value of the shoulder is defined as Is and the ratio thereof is obtained.

In addition, in a case where there are two or more other peaks, a total value of the respective diffraction intensities is defined as Is, and the ratio thereof is obtained.

For the attribute of the diffraction pattern, for example, a database of the International Centre for Diffraction Data (ICDD: registered trademark) can be referred to.

For example, for the diffraction pattern of the magnetoplumbite-type hexagonal ferrite containing Sr, "00-033-1340" of the International Center for Diffraction Data (ICDD) can be referred to. However, in a case where a part of iron is substituted with aluminum, the peak position shifts.

As described above, the single crystal phase of the magnetoplumbite-type hexagonal ferrite is confirmed by the powder X-ray diffraction (XRD) measurement.

Specifically, a method of performing the measurement by using a powder X-ray diffractometer under the following conditions is used.

As the powder X-ray diffractometer, for example, an X'Pert Pro MPD (product name) manufactured by PANalytical can be suitably used. However, the powder X-ray diffractometer is not limited thereto.

—Conditions—

X-ray source: CuKα ray
[Wavelength: 1.54 Å(0.154 nm), output: 40 mA, 45 kV]
Scan range: $20°<2\theta<70°$
Scan interval: 0.05°
Scan speed: 0.75°/min Examples of the shape of the particles each configuring the magnetoplumbite-type hexagonal ferrite powder obtained by the producing method of the disclosure include a plate shape and an irregular shape.

A particle size of particles each configuring the magnetoplumbite-type hexagonal ferrite powder obtained by the producing method of the disclosure is not particularly limited.

In the magnetoplumbite-type hexagonal ferrite powder obtained by the producing method of the disclosure, for example, a diameter ($D_{50}$) at a cumulative percentage of 50% in a particle size distribution based on number measured by a laser diffraction scattering method is 2 µm to 100 µm.

The diameter ($D_{50}$) at a cumulative percentage of 50% of the magnetoplumbite-type hexagonal ferrite powder obtained by the producing method of the disclosure is specifically a value measured by the following method.

500 mL of cyclohexanone is added to 10 mg of the magnetoplumbite-type hexagonal ferrite powder and diluted, stirred using a shaker for 30 seconds, and the obtained liquid is set as a sample for particle size distribution measurement. Then, the particle size distribution is measured by the laser diffraction scattering method using the sample for particle size distribution measurement. A laser diffraction/scattering particle size distribution measurement device is used as the measurement device.

As the laser diffraction/scattering particle size distribution measurement device, for example, Partica LA-960 (product name) manufactured by Horiba, Ltd. can be suitably used. However, the laser diffraction/scattering particle size distribution measurement device is not limited thereto.

A coercivity (Hc) of the magnetoplumbite-type hexagonal ferrite powder obtained by the producing method of the disclosure is preferably 400 kA/m or more, more preferably 500 kA/m or more, and even more preferably 600 kA/m or more.

In a case where the coercivity (Hc) of the magnetoplumbite-type hexagonal ferrite powder is 400 kA/m or more, a radio wave absorber exhibiting excellent radio wave absorption performance even in a high frequency band can be produced.

The upper limit of the coercivity (Hc) of the magnetoplumbite-type hexagonal ferrite powder obtained by the producing method of the disclosure is not particularly limited, and for example, is preferably 1,500 kA/m or less.

A saturation magnetization (δs) per unit mass of the magnetoplumbite-type hexagonal ferrite powder obtained by the producing method of the disclosure is preferably 10 $Am^2/kg$ or more, more preferably 20 $Am^2/kg$ or more, and even more preferably 30 $Am^2/kg$ or more.

In a case where the saturation magnetization (δs) per unit mass of the magnetoplumbite-type hexagonal ferrite powder is 10 $Am^2/kg$ or more, it is possible to produce a radio wave absorber having more excellent radio wave absorption performance.

The upper limit of the saturation magnetization (δs) per unit mass of the magnetoplumbite-type hexagonal ferrite powder obtained by the producing method of the disclosure is not particularly limited, and is preferably, for example, 60 $Am^2/kg$ or less.

The coercivity (Hc) and saturation magnetization (δs) per unit mass of the magnetoplumbite-type hexagonal ferrite powder are values measured using a vibrating sample magnetometer under an environment of an atmosphere temperature of 23° C. and conditions of a maximum applied magnetic field of 3,589 kA/m and a magnetic field sweep speed of 1.994 kA/m/s (second).

As the vibrating sample magnetometer, for example, TM-TRVSM5050-SMSL (product name) manufactured by Tamagawa Manufacturing Co., Ltd. can be suitably used. However, the vibrating sample magnetometer is not limited thereto.

A ratio of a powder other than the magnetoplumbite-type hexagonal ferrite powder in the entire magnetoplumbite-type hexagonal ferrite powder obtained by the producing method of the disclosure is, for example, preferably 20 mass % or less, more preferably 10 mass % or less, even more preferably 5 mass % or less, particularly preferably 0 mass %, that is, not to include the powder other than the magnetoplumbite-type hexagonal ferrite powder, from a viewpoint of producing a radio wave absorber having more excellent radio wave absorption performance.

—Uses of Magnetoplumbite-Type Hexagonal Ferrite Powder—

The magnetoplumbite-type hexagonal ferrite powder obtained by the producing method of the disclosure has excellent magnetic properties, and thus is suitably used for the producing of a radio wave absorber.

In the magnetoplumbite-type hexagonal ferrite powder obtained by the producing method of the disclosure, the ratio of Al atoms to Fe atoms [that is, value of x in Formula (1)] is controlled by the adjusted pH of the raw material aqueous solution in the step A, and accordingly, a desired peak frequency is obtained. According to the magnetoplumbite-type hexagonal ferrite powder obtained by the producing method of the disclosure, a radio wave absorber exhibiting excellent radio wave absorption performance in a target frequency band can be produced.

[Method for Producing Radio Wave Absorber]

The method of producing a radio wave absorber of the disclosure includes a step I of obtaining the magnetoplumbite-type hexagonal ferrite powder by the method for producing the magnetoplumbite-type hexagonal ferrite powder of the disclosure described above, and a step II of forming a molded body using a composition for a radio wave absorber containing the magnetoplumbite-type hexagonal ferrite powder obtained in the step I, and a binder.

A radio wave absorber obtained by the method for producing a radio wave absorber according to the disclosure includes a magnetoplumbite-type hexagonal ferrite powder having a desired peak frequency. Therefore, according to the method for producing a radio wave absorber of the disclosure, it is possible to produce a radio wave absorber exhibiting excellent radio wave absorption performance in a desired frequency band, for example, a high frequency band of 70 GHz to 90 GHz.

<Step I>

The step I is a step of obtaining the magnetoplumbite-type hexagonal ferrite powder by the method for producing the magnetoplumbite-type hexagonal ferrite powder of the disclosure.

The method for producing the magnetoplumbite-type hexagonal ferrite powder of the disclosure is as described above, and therefore the description thereof is omitted here.

<Step II>

The step II is a step of forming a molded body using a composition for a radio wave absorber containing the magnetoplumbite-type hexagonal ferrite powder obtained in the step I (hereinafter, also referred to as a "specific magnetoplumbite-type hexagonal ferrite powder"), and a binder.

The molded body formed in step II forms at least a part of the radio wave absorber.

The molded body formed in the step II may have a planar shape, a three-dimensional shape, or a linear shape.

Examples of the planar shape include a sheet shape and a film shape.

Examples of the three-dimensional shape include a polygonal column having a shape of a triangle or more, a column, a pyramid, a cone, a honeycomb, and the like. In addition, as the three-dimensional shape, a shape obtained by combining the above-described planar shape and the three-dimensional shape is also used.

Examples of the linear shape include a filament shape and a strand shape.

The radio wave absorption performance of the radio wave absorber can be controlled not only by the content of the specific magnetoplumbite-type hexagonal ferrite powder in the radio wave absorber, but also by the shape of the radio wave absorber.

The composition for a radio wave absorber includes the specific magnetoplumbite-type hexagonal ferrite powder.

The composition for a radio wave absorber may include only one kind of the specific magnetoplumbite-type hexagonal ferrite powder, or may include two or more kinds thereof.

The composition for a radio wave absorber may include, for example, two or more kinds of the specific magnetoplumbite-type hexagonal ferrite powders having different compositions.

A content of the specific magnetoplumbite-type hexagonal ferrite powder in the composition for a radio wave absorber is not particularly limited, and is, for example, preferably equal to or greater than 10 mass %, more preferably equal to or greater than 30 mass %, and even more preferably equal to or greater than 50 mass % with respect to a total solid content in the composition for a radio wave absorber, from a viewpoint of ensuring excellent radio wave absorption properties.

In addition, a content of the specific magnetoplumbite-type hexagonal ferrite powder in the composition for a radio wave absorber is, for example, preferably equal to or less than 98 mass %, more preferably equal to or less than 95 mass %, and even more preferably equal to or less than 92 mass % with respect to a total solid content of the composition for a radio wave absorber, from viewpoints of manufacturing suitability and durability of the radio wave absorber.

In the disclosure, in a case where the composition for a radio wave absorber does not contain a solvent, the total solid content in the composition for a radio wave absorber means a total mass of the composition for a radio wave absorber, and in a case where the composition for a radio wave absorber contains a solvent, the total solid content means a total mass excluding the solvent from the composition for a radio wave absorber.

The composition for a radio wave absorber includes a binder.

In the disclosure, the term "binder" is a general term for a substance that can maintain the specific magnetoplumbite-type hexagonal ferrite powder in a dispersed state and form a form of a radio wave absorber.

The binder is not particularly limited, and examples thereof include a resin, rubber, or thermoplastic elastomer (TPE).

Among these, as the binder, for example, a thermoplastic elastomer (TPE) is preferable, from a viewpoint of tensile strength and bending resistance.

The resin may be either a thermoplastic resin or a thermosetting resin.

Specific examples of the thermoplastic resin include an acrylic resin; polyacetal; polyamide; polyethylene; polypropylene; polyethylene terephthalate; polybutylene terephthalate; polycarbonate; polystyrene; polyphenylene sulfide; polypropylene; polyvinyl chloride; an acrylonitrile butadiene styrene (ABS) resin obtained by copolymerization of acrylonitrile, butadiene, and styrene; and an acrylonitrile styrene (AS) resin obtained by copolymerization of acrylonitrile and styrene.

Specific examples of the thermosetting resin include a phenol resin, an epoxy resin, a melamine resin, a urea resin, an unsaturated polyester, a diallyl phthalate resin, a urethane resin, and a silicon resin.

The rubber is not particularly limited and, for example, preferable examples thereof include synthetic rubber such as butadiene rubber; isoprene rubber; chloroprene rubber; halogenated butyl rubber; fluoro rubber; urethane rubber; acrylic rubber (ACM) obtained by copolymerization of acrylates (for example, ethyl acrylate, butyl acrylate, and 2-ethylhexyl acrylate) and other monomers; ethylene-propylene rubber obtained by coordination polymerization of ethylene and propylene using a Ziegler catalyst; butyl rubber (IIR) obtained by copolymerization of isobutylene and isoprene; styrene butadiene rubber (SBR) obtained by copolymerization of butadiene and styrene; acrylonitrile-butadiene rubber (NBR) obtained by copolymerization of acrylonitrile and butadiene; silicone rubber, from viewpoints that mixability with specific magnetoplumbite-type hexagonal ferrite powder is good and the radio wave absorber having more excellent durability, weather resistance, and impact resistance can be produced.

Specific examples of a thermoplastic elastomer include an olefin-based thermoplastic elastomer (TPO), a styrene-based thermoplastic elastomer (TPS), an amide-based thermoplastic elastomer (TPA), and a polyester-based thermoplastic elastomer (TPC).

In a case where the composition for a radio wave absorber of the disclosure contains rubber as the binder, it may contain various additives such as a vulcanizing agent, a vulcanization aid, a softener, and a plasticizer, in addition to the rubber.

Examples of the vulcanizing agent include sulfur, an organic sulfur compound, and a metal oxide.

A melt mass flow rate (hereinafter, also referred to as "MFR") of the binder is not particularly limited, and is, for example, preferably 1 g/10 min to 200 g/10 min, more preferably 3 g/10 min to 100 g/10 min, even more preferably 5 g/10 min to 80 g/10 min, and particularly preferably 10 g/10 min to 50 g/10 min.

In a case where the MFR of the binder is 1 g/10 min or more, fluidity is sufficiently high and the poor appearance is less likely to occur.

In a case where the MFR of the binder is 200 g/10 min or less, mechanical properties such as hardness of a molded body are more easily enhanced.

The MFR of the binder is a value measured under the conditions of a measurement temperature of 230° C. and a load of 10 kg according to JIS K 7210:1999.

The hardness of the binder is not particularly limited and is for example, preferably 5 g to 150 g, more preferably 10 g to 120 g, even more preferably 30 g to 100 g, and particularly preferably 40 g to 90 g, from a viewpoint of moldability.

The hardness of the binder is an instantaneous value measured according to JIS K 6253-3:2012.

The density of the binder is not particularly limited and is, for example, 600 kg/m$^3$ to 1,100 kg/m$^3$, more preferably 700 kg/m$^3$ to 1,000 kg/m$^3$, even more preferably 750 kg/m$^3$ to 1,050 kg/m$^3$, and particularly preferably 800 kg/m$^3$ to 950 kg/m$^3$, from a viewpoint of moldability.

The density of the binder is a value measured according to JIS K 0061:2001.

A 100% tensile stress of the binder is not particularly limited, and is for example, 0.2 MPa to 20 MPa, more preferably 0.5 MPa to 10 MPa, even more preferably 1 MPa to 5 MPa, and particularly preferably 1.5 MPa to 3 MPa, from a viewpoint of moldability.

A tensile strength of the binder is not particularly limited, and is for example, 1 MPa to 20 MPa, more preferably 2 MPa to 15 MPa, even more preferably 3 MPa to 10 MPa, and particularly preferably 5 MPa to 8 MPa, from a viewpoint of moldability.

An elongation at cut of the binder is not particularly limited and is for example, preferably 110% to 1,500%, more preferably 150% to 1,000%, even more preferably 200% to 900%, and particularly preferably 400% to 800%, from a viewpoint of moldability.

The tensile properties described above are values measured according to JIS K 6251:2010. The measurement is performed using a JIS No. 3 dumbbell as a test piece under the condition of a pulling speed of 500 mm/min.

The composition for a radio wave absorber may include only one kind of binder and may include two or more kinds thereof.

A content of the binder in the composition for a radio wave absorber is not particularly limited, and is, for example, preferably equal to or greater than 2 mass %, more preferably equal to or greater than 5 mass %, and even more preferably equal to or greater than 8 mass % with respect to a total solid content of the composition for a radio wave absorber, from a viewpoint of dispersibility of the specific magnetoplumbite-type hexagonal ferrite powder and viewpoints of manufacturing suitability and durability of the radio wave absorber.

In addition, the content of the binder in the composition for a radio wave absorber is, for example, preferably equal to or smaller than 90 mass %, more preferably equal to or smaller than 70 mass %, and even more preferably equal to or smaller than 50 mass %, with respect to a total solid content of the composition for a radio wave absorber, from a viewpoint of ensuring excellent radio wave absorption properties.

In the composition for a radio wave absorber, the specific magnetoplumbite-type hexagonal ferrite powder and the binder may be simply mixed.

The method of mixing the specific magnetoplumbite-type hexagonal ferrite powder and the binder is not particularly limited, and examples thereof include a method of mixing by stirring.

A stirring unit is not particularly limited, and a general stirring device can be used.

As the stirring device, a mixer such as a paddle mixer or an impeller mixer is used.

The stirring time is not particularly limited, and for example, can be suitably set in accordance with the kind of the stirring device or the composition of the composition for a radio wave absorber.

The method for forming the molded body is not particularly limited.

Examples for the method for forming a molded body include a method for applying the composition for a radio wave absorber onto a support and drying, a method for ejecting the composition for a radio wave absorber onto a support by using a nozzle and then drying, a method for injection molding of the composition for a radio wave absorber, and a method for press-molding the composition for a radio wave absorber.

One of the preferable embodiment of the step II is an embodiment including a step II-a1 of applying the composition for a radio wave absorber including the specific magnetoplumbite-type hexagonal ferrite powder and the binder onto a support to form a composition layer for a radio wave absorber, and a step II-a2 of drying the composition layer for a radio wave absorber formed in the step II-a1 to form a radio wave absorption layer.

The radio wave absorption layer in the step II-a2 corresponds to the molded body in the step II.
(Step II-a1)

The step II-a1 is a step of forming a composition layer for a radio wave absorber by applying a composition for a radio wave absorber including the specific magnetoplumbite-type hexagonal ferrite powder and the binder to a support.

Since the specific magnetoplumbite-type hexagonal ferrite powder and the binder in step II-a1 are as described above, the description thereof is omitted here.

The composition for a radio wave absorber in step II-a1 preferably contains a solvent.

The solvent is not particularly limited and examples thereof include, for example, water, an organic solvent, or a mixed solvent of water and an organic solvent.

The organic solvent is not particularly limited, and examples thereof include an alcohol compound such as methanol, ethanol, n-propanol, i-propanol, or methoxypropanol, a ketone compound such as acetone, methyl ethyl ketone, cyclohexane, or cyclohexanone, tetrahydrofuran, acetonitrile, ethyl acetate, and toluene.

Among these, as the solvent, at least one kind selected from methyl ethyl ketone and cyclohexane is preferable, from viewpoints of a comparatively low boiling point and ease of drying.

In a case where the composition for a radio wave absorber includes a solvent, a content of the solvent in the composition for a radio wave absorber is not particularly limited, and is suitably set, for example, in accordance with the kind or amount of the component blended in the composition for a radio wave absorber.

The composition for a radio wave absorber may include various additives (so-called other additives) as necessary, in addition to the specific magnetoplumbite-type hexagonal ferrite powder, the binder, and the solvent.

Examples of other additives include a dispersing agent, a dispersing aid, fungicides, an antistatic agent, and an antioxidant. One component of the other additives may perform more than two functions.

The support is not particularly limited, and a well-known support can be used.

Examples of the material configuring the support include a metal plate (plate of metal such as aluminum, zinc, or copper), a glass plate, a plastic sheet [sheet of polyester (for example, polyethylene terephthalate, polyethylene naphthalate, and polybutylene terephthalate), polyethylene (for example, linear low-density polyethylene, low-density polyethylene, and high-density polyethylene), polypropylene, polystyrene, polycarbonate, polyimide, polyamide, polyamide imide, polysulfone, polyvinyl chloride, polyacrylonitrile, polyphenylene sulfide, polyether imide, polyether sulfone, polyvinyl acetal, or an acrylic resin], a plastic sheet on which metal described above is laminated or vapor-deposited.

The plastic sheet is preferably biaxially stretched.

The support can function to maintain the form of the radio wave absorber. In a case where the formed radio wave absorber can maintain its own form, the support may be removed from the radio wave absorber after producing the radio wave absorber, using a metal plate, a glass plate, or a plastic sheet having a surface subjected to a release treatment.

The shape, the structure, or the size of the support can be suitably selected according to the purpose.

The shape of the support is not particularly limited and is, for example, a flat plate shape.

The structure of the support may be a single-layered structure or a laminated structure of two or more layers.

A size of the support is not particularly limited and can be suitably selected, for example, according to the size of the radio wave absorber and the like.

The thickness of the support is not particularly limited, and is normally approximately 0.01 mm to 10 mm, for example, preferably 0.02 mm to 3 mm and more preferably 0.05 mm to 1 mm, from a viewpoint of handleability.

The method for applying the composition for a radio wave absorber on a support is not particularly limited, and examples thereof include methods using a die coater, a knife coater, an applicator, and the like.

A thickness of the composition layer for a radio wave absorber is not particularly limited and can be, for example, 5 μm to 5 mm.
(Step II-a2)

Step II-a2 is a step of forming a radio wave absorption layer by drying the composition layer for a radio wave absorber formed in Step II-a1.

The method for drying the composition layer for a radio wave absorber is not particularly limited, and examples thereof include a method using a heating device such as an oven.

The drying temperature and drying time are not particularly limited as long as the solvent in the composition layer for a radio wave absorber can be volatilized. As an example, the drying can be performed by heating at 30° C. to 150° C. for 0.01 to 2 hours.

One of the other preferable embodiments of the step II is an embodiment including a step II-b1 of kneading the specific magnetoplumbite-type hexagonal ferrite powder and the binder to obtain a kneaded product, and a step II-b2 of molding the kneaded product obtained in the step II-b1 to obtain a molded body.

The molded body in the step II-b2 corresponds to the molded body in the step II.

(Step II-b1)

The step II-b1 is a step of kneading the specific magnetoplumbite-type hexagonal ferrite powder and the binder to obtain a kneaded product.

Since the specific magnetoplumbite-type hexagonal ferrite powder and the binder in step II-b1 are as described above, the description thereof is omitted here.

In the step II-b1, a solvent, various additives (so-called other additives), and the like may be knead, as necessary, in addition to the specific magnetoplumbite-type hexagonal ferrite powder and the binder, within a range not negatively affecting the effect of the invention.

Since the solvent and other additives in step II-b1 are as described above, the description thereof is omitted here.

A kneading unit is not particularly limited, and a general kneading device can be used.

Examples of the kneading device include devices such as two rolls, a kneader, and an extruder.

The kneading time is not particularly limited, and for example, can be suitably set in accordance with the kind of the kneading device, the kind and the amount of the components to be kneaded, and the like.

(Step II-b2)

The step II-b2 is a step of molding the kneaded product obtained in the step II-b1 to obtain a molded body.

A molding unit is not particularly limited, and examples thereof include press molding, extrusion molding, injection molding, and in-mold forming.

The molding conditions are not particularly limited and can be suitably set according to kinds of components included in the kneaded product, the molding unit, and the like.

The fact that the radio wave absorber obtained by the method for producing the radio wave absorber of the disclosure contains the specific magnetoplumbite-type hexagonal ferrite powder can be confirmed, for example, by the following method.

After the radio wave absorber is finely chopped, it is immersed in a solvent (for example, acetone) for 1 or 2 days, and then dried. The structure can be confirmed by further finely grinding the dried radio wave absorber and performing powder X-ray diffraction (XRD) measurement. After cutting out the cross section of the radio wave absorber, the composition can be confirmed by using, for example, an energy dispersive X-ray analyzer.

EXAMPLES

Hereinafter, the invention will be described in detail with reference to examples, but the invention is not limited to the following examples, within a range not departing the gist thereof.

Production Example 1

(1) Producing of Magnetoplumbite-Type Hexagonal Ferrite Powder

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.7 g of aluminum chloride hexahydrate [$AlCl_3 \cdot 6H_2O$] in 216.0 g of water, and a total amount of a solution prepared by adding 113.0 g of water to 181.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 24.7 g of a 1 mol/L sodium hydroxide aqueous solution was added while maintaining the temperature to obtain a second solution. The pH of the second solution was 9.0. The pH of the second solution was measured using a desktop pH meter #F-71 (product name) manufactured by Horiba, Ltd. (the same applies hereinafter).

Next, the second solution was stirred for 15 minutes to complete the reaction, and a solution containing a reaction product which is a precursor of the magnetoplumbite-type hexagonal ferrite powder (that is, a precursor-containing solution) was obtained.

Next, the precursor-containing solution was subjected to centrifugal separation (rotation speed: 3,000 rpm, rotation time: 10 minutes) three times, and the resulting precipitate was collected.

Next, the collected precipitate was dried in an oven at an internal atmosphere temperature of 80° C. for 12 hours to obtain an aggregate of particles consisting of the precursor (that is, precursor powder).

Next, the powder of the precursor were put in a muffle furnace, and the temperature in the furnace was set to a temperature condition of 1,100° C. in the atmosphere, followed by firing for 4 hours, thereby obtaining a powder 1.

(2) Production of Radio Wave Absorption Sheet 9.0 g of the powder 1 (that is, powder produced by Production Example 1), 1.05 g of acrylonitrile butadiene rubber (NBR) (grade: JSR N215SL, JSR Corporation, binder), and 6.1 g of cyclohexanone were stirred and mixed with a stirring device [Product name: Awatori Neritaro ARE-310, Shinky Co., Ltd.], at a rotation speed of 2,000 rpm for 5 minutes to prepare a composition for a radio wave absorber. Next, the prepared composition for a radio wave absorber was applied onto a glass plate using an applicator to form a composition layer for a radio wave absorber. Next, the formed composition layer for a radio wave absorber was dried in an oven at an internal atmosphere temperature of 80° C. for 2 hours to form a radio wave absorption layer on the glass plate. Then, the radio wave absorption layer was peeled off from the glass plate, and the peeled radio wave absorption layer was set as a radio wave absorption sheet 1 (sheet thickness: 96 pin).

Production Example 2

(1) Producing of Magnetoplumbite-Type Hexagonal Ferrite Powder

The same operation as in the method for producing the powder 1 was performed except that the following operation is performed to obtain a precursor-containing solution, and a powder 2 was obtained.

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.7 g of aluminum chloride hexahydrate [$Al\,Cl_3 \cdot 6H_2O$] in 216.0 g of water, and a total amount of a solution prepared by adding 113.0 g of water to 181.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 30.2 g of a 1 mol/L sodium hydroxide aqueous solution was added while maintaining the temperature to obtain a second solution. The pH of the second solution was 9.5.

Next, the second solution was stirred for 15 minutes to complete the reaction, and a solution containing a reaction product which is a precursor of the magnetoplumbite-type hexagonal ferrite powder (that is, a precursor-containing solution) was obtained.

(2) Production of Radio Wave Absorption Sheet

The same operation as in the method for producing the radio wave absorption sheet 1 was performed except that the powder 2 was used instead of the powder 1, and a radio wave absorption sheet 2 (sheet thickness: 103 µm) was obtained.

Production Example 3

(1) Producing of Magnetoplumbite-Type Hexagonal Ferrite Powder

The same operation as in the method for producing the powder 1 was performed except that the following operation is performed to obtain a precursor-containing solution, and a powder 3 was obtained.

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.7 g of aluminum chloride hexahydrate [$Al\,Cl_3 \cdot 6H_2O$] in 216.0 g of water, and a total amount of a solution prepared by adding 113.0 g of water to 181.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 35.1 g of a 1 mol/L sodium hydroxide aqueous solution was added while maintaining the temperature to obtain a second solution. The pH of the second solution was 10.0.

Next, the second solution was stirred for 15 minutes to complete the reaction, and a solution containing a reaction product which is a precursor of the magnetoplumbite-type hexagonal ferrite powder (that is, a precursor-containing solution) was obtained.

(2) Production of Radio Wave Absorption Sheet

The same operation as in the method for producing the radio wave absorption sheet 1 was performed except that the powder 3 was used instead of the powder 1, and a radio wave absorption sheet 3 (sheet thickness: 101 µm) was obtained.

Production Example 4

(1) Producing of Magnetoplumbite-Type Hexagonal Ferrite Powder

The same operation as in the method for producing the powder 1 was performed except that the following operation is performed to obtain a precursor-containing solution, and a powder 4 was obtained.

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.7 g of aluminum chloride hexahydrate [$Al\,Cl_3 \cdot 6H_2O$] in 216.0 g of water, and a total amount of a solution prepared by adding 113.0 g of water to 181.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 39.8 g of a 1 mol/L sodium hydroxide aqueous solution was added while maintaining the temperature to obtain a second solution. The pH of the obtained second solution was 10.5.

Next, the second solution was stirred for 15 minutes to complete the reaction, and a solution containing a reaction product which is a precursor of the magnetoplumbite-type hexagonal ferrite powder (that is, a precursor-containing solution) was obtained.

(2) Production of Radio Wave Absorption Sheet

The same operation as in the method for producing the radio wave absorption sheet 1 was performed except that the powder 4 was used instead of the powder 1, and a radio wave absorption sheet 4 (sheet thickness: 97 µm) was obtained.

Production Example 5

(1) Producing of Magnetoplumbite-Type Hexagonal Ferrite Powder

The same operation as in the method for producing the powder 1 was performed except that the following operation is performed to obtain a precursor-containing solution, and a powder 5 was obtained.

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.7 g of aluminum chloride hexahydrate [$Al\,Cl_3 \cdot 6H_2O$] in 216.0 g of water, and a total amount of a solution prepared by adding 113.0 g of water to 181.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 45.3 g of a 1 mol/L sodium hydroxide aqueous solution was added while maintaining the temperature to obtain a second solution. The pH of the obtained second solution was 11.0.

Next, the second solution was stirred for 15 minutes to complete the reaction, and a solution containing a reaction product which is a precursor of the magnetoplumbite-type hexagonal ferrite powder (that is, a precursor-containing solution) was obtained.

(2) Production of Radio Wave Absorption Sheet

The same operation as in the method for producing the radio wave absorption sheet 1 was performed except that the powder 5 was used instead of the powder 1, and a radio wave absorption sheet 5 (sheet thickness: 99 μm) was obtained.

Production Example 6

(1) Producing of Magnetoplumbite-Type Hexagonal Ferrite Powder

The same operation as in the method for producing the powder 1 was performed except that the following operation is performed to obtain a precursor-containing solution, and a powder 6 was obtained.

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.7 g of aluminum chloride hexahydrate [$Al Cl_3 \cdot 6H_2O$] in 216.0 g of water, and a total amount of a solution prepared by adding 113.0 g of water to 181.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 50.8 g of a 1 mol/L sodium hydroxide aqueous solution was added while maintaining the temperature to obtain a second solution. The pH of the obtained second solution was 11.5.

Next, the second solution was stirred for 15 minutes to complete the reaction, and a solution containing a reaction product which is a precursor of the magnetoplumbite-type hexagonal ferrite powder (that is, a precursor-containing solution) was obtained.

(2) Production of Radio Wave Absorption Sheet

The same operation as in the method for producing the radio wave absorption sheet 1 was performed except that the powder 6 was used instead of the powder 1, and a radio wave absorption sheet 6 (sheet thickness: 107 μm) was obtained.

Production Example 7

(1) Producing of Magnetoplumbite-Type Hexagonal Ferrite Powder

The same operation as in the method for producing the powder 1 was performed except that the following operation is performed to obtain a precursor-containing solution, and a powder 7 was obtained.

A total amount of a raw material aqueous solution prepared by dissolving 57.0 g of iron (III) chloride hexahydrate [$FeCl_3 \cdot 6H_2O$], 27.8 g of strontium chloride hexahydrate [$SrCl_2 \cdot 6H_2O$], and 10.7 g of aluminum chloride hexahydrate [$Al Cl_3 \cdot 6H_2O$] in 216.0 g of water, and a total amount of a solution prepared by adding 113.0 g of water to 181.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 55.6 g of a 1 mol/L sodium hydroxide aqueous solution was added while maintaining the temperature to obtain a second solution. The pH of the obtained second solution was 12.0.

Next, the second solution was stirred for 15 minutes to complete the reaction, and a solution containing a reaction product which is a precursor of the magnetoplumbite-type hexagonal ferrite powder (that is, a precursor-containing solution) was obtained.

(2) Production of Radio Wave Absorption Sheet

The same operation as in the method for producing the radio wave absorption sheet 1 was performed except that the powder 7 was used instead of the powder 1, and a radio wave absorption sheet 7 (sheet thickness: 104 μm) was obtained.

Production Example 8

(1) Producing of Magnetoplumbite-Type Hexagonal Ferrite Powder

A total amount of a raw material aqueous solution prepared by dissolving 57.0 g of iron (III) chloride hexahydrate [$FeCl_3 \cdot 6H_2O$], 22.3 g of strontium chloride hexahydrate [$SrCl_2 \cdot 6H_2O$], 2.6 g of barium chloride dihydrate [$BaCl_2 \cdot 2H_2O$], 1.5 g of calcium chloride dihydrate [$CaCl_2 \cdot 2H_2O$], and 10.2 g of aluminum chloride hexahydrate [$Al Cl_3 \cdot 6H_2O$] in 216.0 g of water, and a total amount of a solution prepared by adding 113.0 g of water to 181.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 30.4 g of a 1 mol/L sodium hydroxide aqueous solution was added while maintaining the temperature to obtain a second solution. The pH of the second solution was 9.5.

Next, the second solution was stirred for 15 minutes to complete the reaction, and a solution containing a reaction product which is a precursor of the magnetoplumbite-type hexagonal ferrite powder (that is, a precursor-containing solution) was obtained.

Next, the precursor-containing solution was subjected to centrifugal separation (rotation speed: 3,000 rpm, rotation time: 10 minutes) three times, and the resulting precipitate was collected.

Next, the collected precipitate was dried in an oven at an internal atmosphere temperature of 80° C. for 12 hours to obtain an aggregate of particles consisting of the precursor (that is, precursor powder).

Next, the powder of the precursor were put in a muffle furnace, and the temperature in the furnace was set to a temperature condition of 1,100° C. in the atmosphere, followed by firing for 4 hours, thereby obtaining a powder 8.

(2) Production of Radio Wave Absorption Sheet

The same operation as in the method for producing the radio wave absorption sheet 1 was performed except that the powder 8 was used instead of the powder 1, and a radio wave absorption sheet 8 (sheet thickness: 100 μm) was obtained.

Production Example 9

(1) Producing of Magnetoplumbite-Type Hexagonal Ferrite Powder

The same operation as in the method for producing the powder 8 was performed except that the following operation is performed to obtain a precursor-containing solution, and a powder 9 was obtained.

A total amount of a raw material aqueous solution prepared by dissolving 57.0 g of iron (III) chloride hexahydrate [$FeCl_3 \cdot 6H_2O$], 22.3 g of strontium chloride hexahydrate [$SrCl_2 \cdot 6H_2O$], 2.6 g of barium chloride dihydrate [$BaCl_2 \cdot 2H_2O$], 1.5 g of calcium chloride dihydrate

[CaCl$_2$·2H$_2$O], and 10.2 g of aluminum chloride hexahydrate [Al Cl$_3$·6H$_2$O] in 216.0 g of water, and a total amount of a solution prepared by adding 113.0 g of water to 181.3 g of 5 mol/L sodium hydroxide aqueous solution were added to 400.0 g of water kept at 35° C. and stirred, respectively, at a flow rate of 10 mL/min and the same timing, to obtain a first solution.

Next, after changing the temperature of the first solution to 25° C., 39.8 g of a 1 mol/L sodium hydroxide aqueous solution was added while maintaining the temperature to obtain a second solution. The pH of the obtained second solution was 10.5.

Next, the second solution was stirred for 15 minutes to complete the reaction, and a solution containing a reaction product which is a precursor of the magnetoplumbite-type hexagonal ferrite powder (that is, a precursor-containing solution) was obtained.

(2) Production of Radio Wave Absorption Sheet

The same operation as in the method for producing the radio wave absorption sheet 1 was performed except that the powder 9 was used instead of the powder 1, and a radio wave absorption sheet 9 (sheet thickness: 100 μm) was obtained.

1. Confirmation of Crystal Structure

The crystal structure of the magnetic material forming each powder of a powder 1 to a powder 9 (hereinafter, also referred to as "magnetic material 1 to magnetic material 9") was confirmed by an X-ray diffraction (XRD) method.

Specifically, it was confirmed whether or not the magnetoplumbite-type crystal structure is obtained and whether the crystal structure had a single phase or two crystal phase.

An X'Pert Pro MPD (product name) manufactured by PANalytical which is the powder X-ray diffractometer was used as a measurement device. The measurement conditions are shown below.

—Measurement Conditions—
X-ray source: CuKα ray
[Wavelength: 1.54 Å(0.154 nm), output: 40 mA, 45 kV]
Scan range: 20°<2 θ<70°
Scan interval: 0.05°
Scan speed: 0.75°/min As a result, it is confirmed that each of the magnetic materials 1 to 9 is a single-phase magnetoplumbite-type hexagonal ferrite having a magnetoplumbite-type crystal structure without the crystal structure other than the magnetoplumbite type.

2. Confirmation of Composition

The composition of the magnetic material forming each powder of the powder 1 to the powder 9 (that is, magnetic material 1 to magnetic material 9) was confirmed by high frequency inductively coupled plasma (ICP) emission spectroscopy.

Specifically, a beaker that is a pressure-resistant container containing 12 mg of each of powder and 10 mL of a 4 mol/L hydrochloric acid aqueous solution was held in an oven at a set temperature of 120° C. for 12 hours to obtain a solution. 30 mL of pure water was added to the obtained solution, which is then filtered using a 0.1 μm membrane filter. Elemental analysis of the filtrate obtained as described above was performed using a high frequency inductively coupled plasma (ICP) emission spectrometer [model number: ICPS-8100, Shimadzu Corporation].

Based on the obtained elemental analysis results, a content of each metal atom with respect to 100 atom % of Fe atoms was obtained. Then, based on the obtained content, the composition of the magnetic material 1 to the magnetic material 9 was confirmed. The composition of each magnetic material of the magnetic material 1 to the magnetic material 9 is shown below.

Magnetic material 1: SrFe$_{(9.65)}$Al$_{(2.35)}$O$_{19}$
Magnetic material 2: SrFe$_{(9.72)}$Al$_{(2.28)}$O$_{19}$
Magnetic material 3: SrFe$_{(9.79)}$Al$_{(2.21)}$O$_{19}$
Magnetic material 4: SrFe$_{(9.86)}$Al$_{(2.14)}$O$_{19}$
Magnetic material 5: SrFe$_{(10.00)}$Al$_{(2.00)}$O$_{19}$
Magnetic material 6: SrFe$_{(10.13)}$Al$_{(1.87)}$O$_{19}$
Magnetic material 7: SrFe$_{(10.20)}$Al$_{(1.80)}$O$_{19}$
Magnetic Material 8: Sr$_{(0.80)}$Ba$_{(0.10)}$Ca$_{(0.10)}$Fe$_{(9.69)}$Al$_{(2.31)}$O$_{19}$
Magnetic Material 9: Sr$_{(0.80)}$Ba$_{(0.10)}$Ca$_{(0.10)}$Fe$_{(9.83)}$Al$_{(2.17)}$O$_{19}$ 3. Peak Frequency of Magnetic Permeability μ"

Each radio wave absorption sheet of the radio wave absorption sheet 1 to the radio wave absorption sheet 9 was cut into strips of 20 mm×70 mm to obtain a radio wave absorption sheet for evaluation. An S parameter at an incidence angle of 0° of this radio wave absorption sheet for evaluation was measured in a range of 48 GHz to 93 GHz by the free space method. Then, from the measured S parameter, a peak frequency of magnetic permeability (unit: GHz) was calculated using the Nicholson-Loss model method. The measurement device used was a network analyzer manufactured by Agilent Technologies.

Table 1 and Table 2 show the value of x in Formula (1), the pH of the second solution (that is, the adjusted pH of the raw material aqueous solution), and the peak frequency of the magnetic permeability μ".

In addition, FIG. 1 is a graph showing a relationship between a value of x in Formula (1) and a peak frequency of magnetic permeability μ". Each plot in FIG. 1 corresponds to the "value of x" and "peak frequency of magnetic permeability p," in Production Examples 1 to 7 shown in Table 1.

In Table 1, the "radio wave absorption sheet 1 to the radio wave absorption sheet 7" are referred to as a "sheet 1 to sheet 7", respectively. In addition, in Table 2, the "radio wave absorption sheet 8 and the radio wave absorption sheet 9" are referred to as a "sheet 8 and a sheet 9", respectively.

TABLE 1

|  | Production Example 1 | Production Example 2 | Production Example 3 | Production Example 4 | Production Example 5 | Production Example 6 | Production Example 7 |
|---|---|---|---|---|---|---|---|
| Kind of powder | Powder 1 | Powder 2 | Powder 3 | Powder 4 | Powder 5 | Powder 6 | Powder 7 |
| Kind of radio wave absorption sheet | Sheet 1 | Sheet 2 | Sheet 3 | Sheet 4 | Sheet 5 | Sheet 6 | Sheet 7 |
| Value of x | 2.35 | 2.28 | 2.21 | 2.14 | 2.00 | 1.87 | 1.80 |
| pH of second solution | 9.0 | 9.5 | 10.0 | 10.5 | 11.0 | 11.5 | 12.0 |

TABLE 1-continued

|  | Production Example 1 | Production Example 2 | Production Example 3 | Production Example 4 | Production Example 5 | Production Example 6 | Production Example 7 |
|---|---|---|---|---|---|---|---|
| Magnetic permeability μ" Peak frequency [GHz] | 87.2 | 85.1 | 82.3 | 79.8 | 76.5 | 72.8 | 69.3 |

TABLE 2

|  | Production Example 8 | Production Example 9 |
|---|---|---|
| Kind powder | Powder 8 | Powder 9 |
| Kind of radio wave absorption sheet | Sheet 8 | Sheet 9 |
| Value of x | 2.31 | 2.17 |
| pH of second solution | 9.5 | 10.5 |
| Magnetic permeability μ" Peak frequency [GHz] | 83.4 | 77.8 |

From the results shown in Table 1 and Table 2, it was found that, according to the producing method of the disclosure, in the step A of adjusting the pH of the raw material aqueous solution to exceed 8.0 to obtain the reaction product, the ratio of Al atoms to Fe atoms in the magnetoplumbite-type hexagonal ferrite finally obtained [that is, value of x in Formula (1)] decreases by increasing adjusted pH of the raw material aqueous solution, and there is a high correlation between the adjusted pH of the raw material aqueous solution and the value x in Formula (1).

In addition, from the results shown in Table 1 and FIG. 1, it was found that there is a high correlation between the value of x in Formula (1) and the peak frequency of the magnetic permeability μ".

From the above, it was clear that the producing method of the disclosure includes the step A of adjusting the pH of the raw material aqueous solution to exceed 8 to obtain the reaction product, so that the value of x in Formula (1) can be controlled by the adjusted pH of the raw material aqueous solution, and accordingly, the powder of the magnetoplumbite-type hexagonal ferrite having a desired peak frequency can be produced.

The contents of JP2018-159194 filed on Aug. 28, 2018 are incorporated herein by reference.

All of the documents, the patent applications, and the technology standards described here are incorporated here by reference.

What is claimed is:

1. A method for producing a powder of a magnetoplumbite-type hexagonal ferrite which is an aggregate of particles of a compound represented by Formula (1), the method comprising:

a step A of adjusting a pH of an aqueous solution containing a Fe salt, an Al salt, and at least one metal element salt selected from the group consisting of a Sr salt, a Ba salt, a Ca salt, and a Pb salt to exceed 8.0, thereby obtaining a reaction product;

a step B of drying the reaction product obtained in the step A, thereby obtaining a dried product; and a step C of firing the dried product obtained in Step B, thereby obtaining a fired product, $$AFe_{(12-x)}Al_xO_{19} \quad \text{Formula (1)}$$

in Formula (1), A represents at least one metal element selected from the group consisting of Sr, Ba, Ca, and Pb, and x satisfies 1.5≤x≤8.0, wherein, in the step A, a liquid temperature of the aqueous solution is 15° C. to 40° C.

2. The method for producing a powder of a magnetoplumbite-type hexagonal ferrite according to claim 1, wherein the at least one metal element salt is selected from the group consisting of a Sr salt, a Ba salt, and a Ca salt.

3. The method for producing a powder of a magnetoplumbite-type hexagonal ferrite according to claim 1, wherein the at least one metal element salt includes a Sr salt.

4. The method for producing a powder of a magnetoplumbite-type hexagonal ferrite according to claim 1, wherein, in the step A, the pH of the aqueous solution is adjusted to be 9.5 or more to obtain the reaction product.

5. The method for producing a powder of a magnetoplumbite-type hexagonal ferrite according to claim 1, wherein, in the step A, the pH of the aqueous solution is adjusted to be 9.0 or more to obtain the reaction product.

6. The method for producing a powder of a magnetoplumbite-type hexagonal ferrite according to claim 1, wherein x in Formula (1) satisfies 1.5≤x≤3.0.

7. A method for producing a radio wave absorber, the method comprising:

a step I of obtaining a powder of a magnetoplumbite-type hexagonal ferrite by the method for producing a powder of a magnetoplumbite-type hexagonal ferrite according to claim 1; and a step II of forming a molded body using a composition for a radio wave absorber containing the powder of the magnetoplumbite-type hexagonal ferrite obtained in the step I, and a binder.

\* \* \* \* \*